(12) United States Patent
Temerinac et al.

(10) Patent No.: US 7,330,141 B2
(45) Date of Patent: Feb. 12, 2008

(54) COMPENSATION CIRCUIT AND COMPENSATION METHOD TO COMPENSATE NONLINEAR DISTORTIONS OF AN A/D CONVERTER

(75) Inventors: Miodrag Temerinac, Gundelfingen (DE); Norbert Greitschus, Endingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 10/779,317

(22) Filed: Feb. 13, 2004

(65) Prior Publication Data

US 2004/0233083 A1 Nov. 25, 2004

(30) Foreign Application Priority Data

Feb. 13, 2003 (DE) ................. 103 05 972

(51) Int. Cl.
*H03M 1/10* (2006.01)
(52) U.S. Cl. ................. 341/120; 341/155
(58) Field of Classification Search ........... 341/120, 341/143, 118, 155
See application file for complete search history.

(56) References Cited

U.S. PATENT DOCUMENTS

| | | | |
|---|---|---|---|
| 4,746,902 A | 5/1988 | Tol et al. ................. 340/347 |
| 4,996,530 A | 2/1991 | Hilton ................. 341/120 |
| 5,047,772 A | 9/1991 | Ribner ................. 341/156 |
| 5,179,379 A | 1/1993 | Allen et al. ................. 341/118 |
| 5,210,735 A | 5/1993 | Hoshino et al. ......... 369/53.13 |
| 5,230,011 A | 7/1993 | Gielis et al. ................. 375/97 |
| 5,561,716 A | 10/1996 | Kasser et al. ................. 381/15 |
| 5,594,612 A | 1/1997 | Henrion ................. 341/120 |
| 5,659,312 A | 8/1997 | Sunter et al. ................. 341/120 |
| 5,759,890 A | 6/1998 | Chao ................. 438/253 |
| 5,789,689 A * | 8/1998 | Doidic et al. ................. 84/603 |
| 5,870,041 A | 2/1999 | Lee et al. ................. 341/118 |
| 6,036,518 A | 3/2000 | Kajiwara ................. 702/89 |
| 6,192,031 B1 | 2/2001 | Reeder et al. ................. 341/159 |
| 6,198,416 B1 | 3/2001 | Velazquez ................. 341/118 |
| 6,265,949 B1 * | 7/2001 | Oh ................. 332/103 |
| 6,271,781 B1 * | 8/2001 | Pellon ................. 341/143 |

(Continued)

FOREIGN PATENT DOCUMENTS

DE 19720766 11/1998

(Continued)

OTHER PUBLICATIONS

Dr. Macleod, "Fast calibration of IQ digitizer systems", Electronic Engineering, No. 757, Jan. 1990.

(Continued)

*Primary Examiner*—Peguy JeanPierre
(74) *Attorney, Agent, or Firm*—O'Shea, Getz & Kosakowski, P.C.

(57) ABSTRACT

The invention relates to a compensation circuit (1–6) to compensate nonlinear distortions of an A/D converter comprising a signal input and a compensation system. In order to avoid the high costs related to the complex analog design of the A/D converter and/or the high energy consumption in this converter and compensation system, it is proposed that a compensation circuit be used that is composed of digital circuit elements that are connected following the A/D converter and which has a nonlinearly distorted output signal of the A/D converter supplied to it to compensate the nonlinear distortion. Adaptive coefficients are preferably employed here for the compensation.

18 Claims, 4 Drawing Sheets

U.S. PATENT DOCUMENTS

| | | |
|---|---|---|
| 6,445,317 B2 | 9/2002 | Lundin et al. ............... 341/120 |
| 6,621,431 B2 | 9/2003 | Engl et al. .................. 341/120 |
| 6,639,537 B1 * | 10/2003 | Raz ............................ 341/155 |
| 6,970,120 B1 * | 11/2005 | Bjornsen .................... 341/120 |
| 2002/0009164 A1 | 1/2002 | Prichett et al. ............. 375/340 |
| 2002/0093439 A1 | 7/2002 | Lundim et al. ............. 341/120 |
| 2002/0126028 A1 | 9/2002 | Feste et al. ................. 341/120 |
| 2002/0196864 A1 | 12/2002 | Booth et al. ................ 375/296 |
| 2004/0233083 A1 | 11/2004 | Temerinac et al. .......... 341/120 |
| 2007/0176807 A1 * | 8/2007 | Mattes et al. ............... 341/118 |

FOREIGN PATENT DOCUMENTS

| | | | |
|---|---|---|---|
| WO | WO 01/05026 | 1/2001 | ...................... 1/32 |

OTHER PUBLICATIONS

Tan et al., "Adaptive Volterra Filters for Active Control of Noise Processes," IEEE Transactions on Signal Processing, vol. 49, No. 8, Aug. 2001, pp.1667-1676.

* cited by examiner

COMPENSATION CIRCUIT AND COMPENSATION METHOD TO COMPENSATE NONLINEAR DISTORTIONS OF AN A/D CONVERTER

BACKGROUND OF THE INVENTION

The invention relates to the field of analog-to-digital signal conversion, and in particular to a compensation circuit to compensate nonlinear distortions of an analog-to-digital (A/D) converter.

A/D converters are a critical component in integrated circuits having mixed signal processing (i.e., analog and digital signal processing). Requirements related to the linearity of the A/D converter are quite difficult to achieve given the usual tolerances for analog components. The measures required for this purpose in the area of analog design entail high cost and/or high current consumption by the circuit.

In order to prevent nonlinear distortions in the analog-to-digital conversion process of the A/D converter, compensation circuits are employed to compensate for these nonlinear distortions of the A/D converter. The compensation circuits have an analog signal input, and are typically located on the input side of the A/D converter.

There is a need for a compensation circuit that compensates for nonlinear distortions of an A/D converter, and requires a simplified overall analog design together with, preferably, reduced current consumption.

SUMMARY OF THE INVENTION

A compensation circuit to compensate for nonlinear distortions of an A/D converter may include a signal input and a compensation circuit composed of digital circuit elements to digitally compensate for the nonlinear distortions, the signal input as the compensation input being a digital signal input to supply a signal outputted in distorted form by the A/D converter. Implementation is thus in the form of an output-side digital compensation or distortion correction of the nonlinear distortions from an input-side A/D converter. The digital circuit elements required for this purpose are inexpensive and readily available based on a simple digital circuit design. Advantageously, it is no longer necessary to incur high costs or have increased current consumption based on a compensation circuit added on the input-side of, or integrated into, the A/D converter.

DETAILED DESCRIPTION OF THE INVENTION

Figure 1:
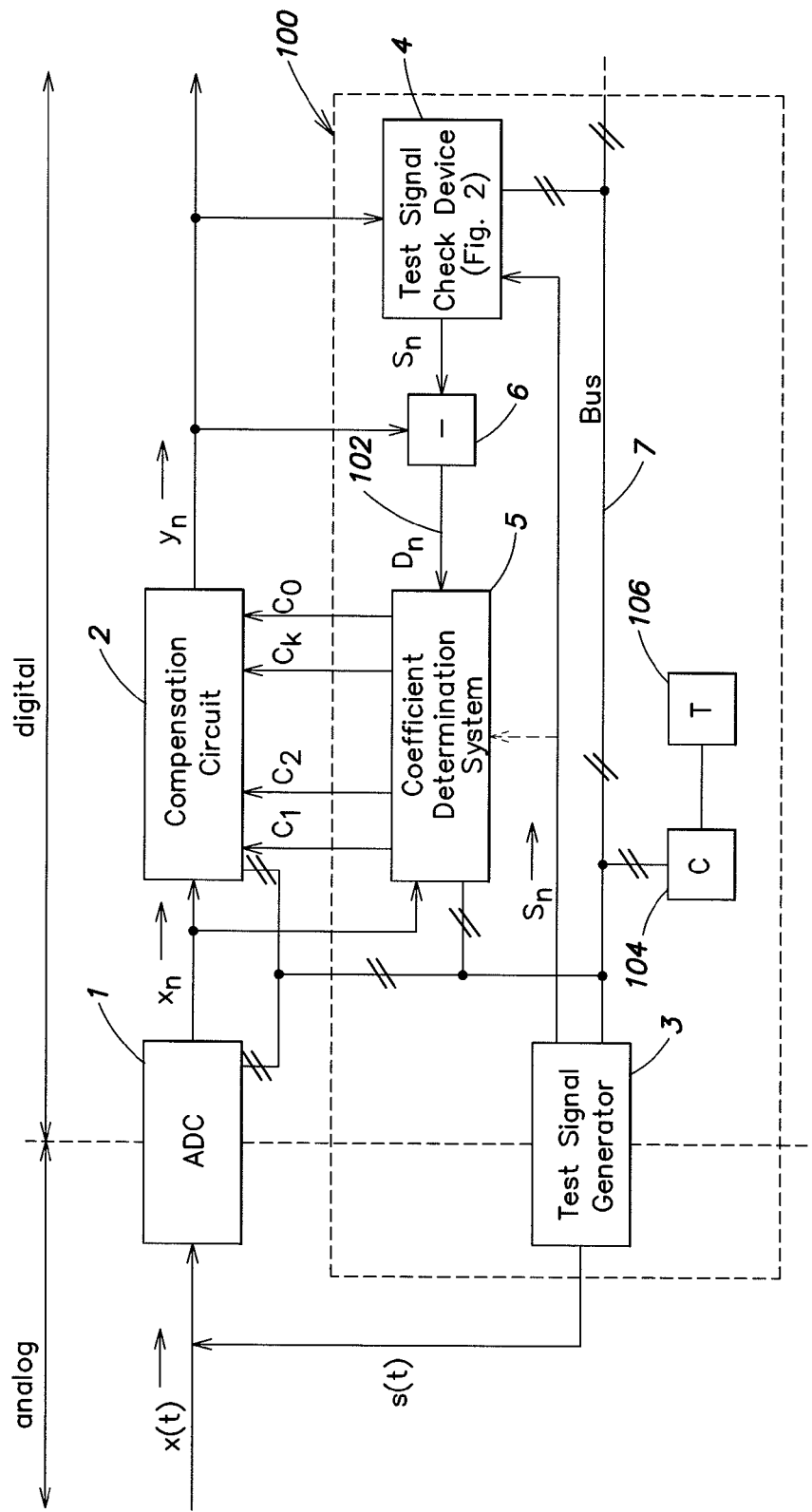
FIG. 1 is a block diagram illustration of a compensation circuit to compensate for nonlinear distortions of an A/D converter.

FIG. 1 is a block diagram illustration of a compensation circuit to compensate for nonlinear distortions of an A/D converter. The compensation circuit in the example is composed of an analog section, shown at left, and a digital section shown on the right. An analog input signal x(t) is supplied to an A/D converter (ADC) 1, which provides a digital sequence $x_n$ corresponding to the analog input signal x(t). When a conventional ADC 1 is used, the digital sequence $x_n$ from this converter exhibits nonlinear distortion. The index n represents the sequence of sampling values $x_n$, n=0, 1, 2, . . . .

The A/D-converted sequence $x_n$ is input of a compensation circuit 2, which compensates or corrects the nonlinear distortion created by the ADC 1. The compensation circuit 2 provides compensated digital data $y_n$.

The compensation circuit 2 receives coefficients $c_1$, $c_2$, . . . $c_K$, $c_0$ that have been determined or calculated based on the nonlinear distortion response of the ADC 1. The index k=1, 2, . . . , K here functions as the consecutive index for the coefficients $c_k$ of compensation.

The circuit of this design includes an ADC 1 together with the compensation circuit 2 to which a set of coefficients $c_1$, . . . $c_K$ is supplied offers a simple design which enables an analog-to-digital conversion of an analog signal x(t) to form a sequence of compensated digital data $y_n$ which does not suffer from nonlinear distortion.

A coefficient computation unit 100 determines the coefficients $c_1$, . . . $c_K$. These additional components are advantageously active only during a configuration phase. As an alternative to the circuit described below, it is also possible to employ a memory in which a set of coefficients $c_1$, . . . $c_K$, determined previously only once, is stored which may be applied generally for the compensation. However, the preferred approach is the circuit design described below which provides an adjustment of the coefficients $c_1$, . . . $c_K$ to the actual and/or instantaneous conditions.

Referring to FIG. 1, a test signal s(t) is generated by a test signal generator 3 and applied during the configuration phase to the input of the ADC converter 1. The test signal generator 3 also provides either the parameters $s_n$ to generate the analog test signal s(t) or a sequence of digital test signal data $S_n$ corresponding to this analog test signal s(t). These parameters $s_n$ or test signal data $S_n$ are fed to a coefficient determination system 5 and/or to a test signal check device 4.

The coefficient determination system 5 determines the coefficients $c_1$, . . . $c_K$ to be used by the compensation circuit 2. The coefficient determination system 5 receives the digital data $x_n$ from the ADC 1. The coefficient determination system 5 also receives distortion data or difference data $D_n$ on a line 102. The difference data $D_n$ are provided by a subtracter 6 to which the sequence of the compensated digital data $y_n$ is fed from the output of the compensation circuit 2. The subtracter 6 also receives a sequence of digital signal data $S_n$ either directly or indirectly through the test signal check device 4. The sequence of digital signal data $S_n$ corresponds in the configuration phase to a signal map of the test signal, whereby, after appropriate determination of coefficients has been effected, this signal map is as undistorted as possible, or ideally is completely undistorted.

During the configuration phase, the analog test signal s(t) is generated and fed to the ADC 1, which provides the sequence of digital data $x_n$ to the compensation circuit 2 and the coefficient determination circuit 5. If the set of coefficients $c_1$, . . . $c_K$ is not available, the compensation circuit 2 outputs the sequence of digital data $x_n$ as the sequence of compensated digital data $y_n$ (i.e., $y_n = x_n$). This data is fed to the subtracter 6, which is also supplied with a corresponding sequence of digital test signal data $S_n$ matching an undistorted data set. After subtraction of the two sequences of data ($y_n-S_n$), the data sequence of the difference signal $D_n$ on a line 102 is supplied to the coefficient determination system 5. According to a preferred embodiment, a test signal s(t) is subsequently sent by the test signal generator 3, which may also be composed of a memory with an analog test signal s(t) and a corresponding digital parameter set $s_n$, to the ADC 1. The sequence of digital data $x_n$ generated by the ADC 1 is subsequently compensated by the compensation circuit 2 in accordance with this supplied set of coefficients $c_1, \ldots c_K$, such that the sequence of compensated digital data $y_n$ is output, ideally with already optimized coefficients $c_1, \ldots c_K$, without nonlinear distortion. The sequence of compensated digital data $y_n$ is in turn fed to the subtracter 6 in which, after subtraction using the corresponding values of the sequence of digital test signal data $S_n$, the sequence of data $D_n$ of the difference signal is again generated. This difference data $D_n$ is again fed to the coefficient determination system 5 which, in the event the difference data $D_n$ does not equal zero or exceeds predetermined threshold values, implements another, or preferably, an iteratively improved determination of coefficients to provide improved coefficients $c_1, \ldots c_K$.

After a sufficiently distortion-corrected or compensated set of coefficients $c_1, \ldots c_K$ has been determined, the configuration phase ends, after which the circuit composed of the ADC 1 and the compensation circuit 2 implements a conversion and compensation of the analog signal x(t) to form a sequence of compensated digital data $y_n$.

A configuration phase is initiated at regular intervals to check the set of coefficients used, $c_1, \ldots c_K$ in terms of their current validity. In this way drifting nonlinear distortions caused for example by the circuit heating up or other interfering effects from the environment can be compensated.

The configuration phase is turned on and off as needed so that any slow changes in nonlinear distortions can be detected early enough and then compensated. It is, of course, in principle also possible to implement a predetermination and consideration of anticipated additional degradations or improvements related to the generation of distortions.

A control device 104 is advantageously employed to control the compensation circuit, the control device 104 being connected to a time-monitoring device, specifically, a timer 106. In addition to turning the configuration phase on and off, the control device 104 also controls the individual components through, for example, a bus 7.

In particular, it is possible to provide different types of test signals s(t), $S_n$ for different application areas of the circuit so that coefficients $c_1, \ldots c_K$ may, for example, be optimally adjusted for a low-frequency or high-frequency analog signal x(t).

The following discussion examines in more detail the circuit components and the operational sequences of the method with reference to the mathematical background.

The configuration phase starts with an analog test signal s(t), to which the theoretical uncorrupted sampling values $$S_n = s\left(\frac{n}{Fs}\right),$$

correspond after analog-to-digital conversion, without nonlinear distortion, which values are in turn to be output after optimal compensation from the compensation circuit 2 as the sequence of compensated digital data $y_n$. Here n is a consecutive index of the set of natural numbers, while $F_s$ is the sampling frequency of the ADC 1.

After analog-to-digital conversion has been performed on the analog test signal s(t) the sequence of digital data $x_n$ is supplied to its output based according to the expression $$x_n = s_n + d_n.$$

The sequence of digital data $x_n$ thus corresponds to the summation of correct theoretical and uncorrupted sampling values $s_n$, and the respective distortion data value $d_n$ which matches the corresponding distortion by the A/D converter 1.

The digital compensation circuit 2 which uses the coefficients $c_1, \ldots C_K$ to generate the sequence of compensated digital signals $y_n$ that are ultimately to be output must therefore perform a compensation having the characteristic that may be described by a $K^{th}$-order polynomial:

$$y_n = \sum_{k=1}^{K} c_k \cdot x_n^k = v \cdot s_n + D_n = S_n + D_n. \quad (1)$$

Here the coefficient values $c_k$ with k=1, 2, ... K are adaptive coefficients, that is, coefficients which may be adjusted as necessary. The output signal, or sequence of outputted compensated digital data $y_n$ contains a map of the test signal or of the sequence of the digital test signal data $S_n$ plus a possible change v, specifically, amplification or attenuation. The sequence of the compensated digital data $S_n$ is thus the product of a distortion factor v and the sequence of the digital test signal data $S_n$ which may be described by $$S_n = v \cdot s_n,$$

where the effective distortions of the switching sequence of the ADC 1 and, in the event of insufficient compensation, of the compensation circuit 2 may be described by the sequence of difference data $D_n$ according to the expression $$D_n = y_n - S_n. \quad (2)$$

Since the parameters $s_n$ of the test signal are known, the sequence of output signal data $S_n$ may be extracted from the sequence of the compensated digital data $y_n$ by the test signal check device 4 to enable the actual distortion data or difference data $D_n$ in data $y_n$ to be calculated at the output of the compensation circuit 2. In addition, the gradients of the rms distortion may be calculated using the expression $$\frac{\partial D_n^2}{\partial c_k} = 2 \cdot (y_n - S_n) \cdot x_n^k = 2 \cdot D_n \cdot x_n^k.$$

The use of an iterative method allows the set of coefficients $c_k$ to converge. To this end, the formulation $$c_k^{n+1} = c_k^n - G \cdot D_n \cdot x_n^k \quad (3)$$

may be selected so as ultimately to minimize the rms distortion or output. A parameter G is introduced in equation (3) as a stability criterion, which parameter at the same time provides for the highest possible convergence rate. The term $c_k^n$ describes the value of the coefficients $c_k$ in the $n^{th}$ iteration step, the coefficient of compensation $c_k$ again having the consecutive index k=1, ..., K. The iteration steps are preferably counted from the value zero, so that n=0, 1, ....

In an especially preferred embodiment, a sinusoidal test signal s(t)=sin[2πt] is preferably used as the test signal to perform the nonlinear compensation since it is then simpler for the A/D converter 1 to determine the structure of the distortions, and is possibly simpler for the compensation circuit 2 to determine additional distortions. A nonlinearly distorting ADC 1 having a sinusoidal input signal at a frequency $F_t$ produces harmonics on frequencies $p \cdot F_t$, which may be folded back by sampling to form $$f_k = \begin{cases} (p \cdot F_t)_{mod\ Fs} & (p \cdot F_t)_{mod\ Fs} \leq \dfrac{F_s}{2} \\ F_s - (p \cdot F_t)_{mod\ Fs} & (p \cdot F_t)_{mod\ Fs} \geq \dfrac{F_s}{2} \end{cases}.$$

Here p=2, 3, . . . , M is the consecutive index of the frequency calculation.

If the first harmonics are significant, specifically, if p=2, . . . , M applies, the test frequency $F_t$ should be selected such that the frequency band 2B is maximized around the fundamental where none of the first M harmonics fold back according to the expression $$B = \max_{F_t} \left\{ \min_{p=2,\ldots,M} \{|F_t - fp|\} \right\}. \tag{4}$$

The extraction of the test signal or sequence of the output signal data $S_n$ may be implemented using a known method of carrier processing. Another factor which must be taken into account is that the test signal s(t) or the sequence of the output signal data $S_n$ assigned to this signal are amplitude-conforming.

Figure 2:
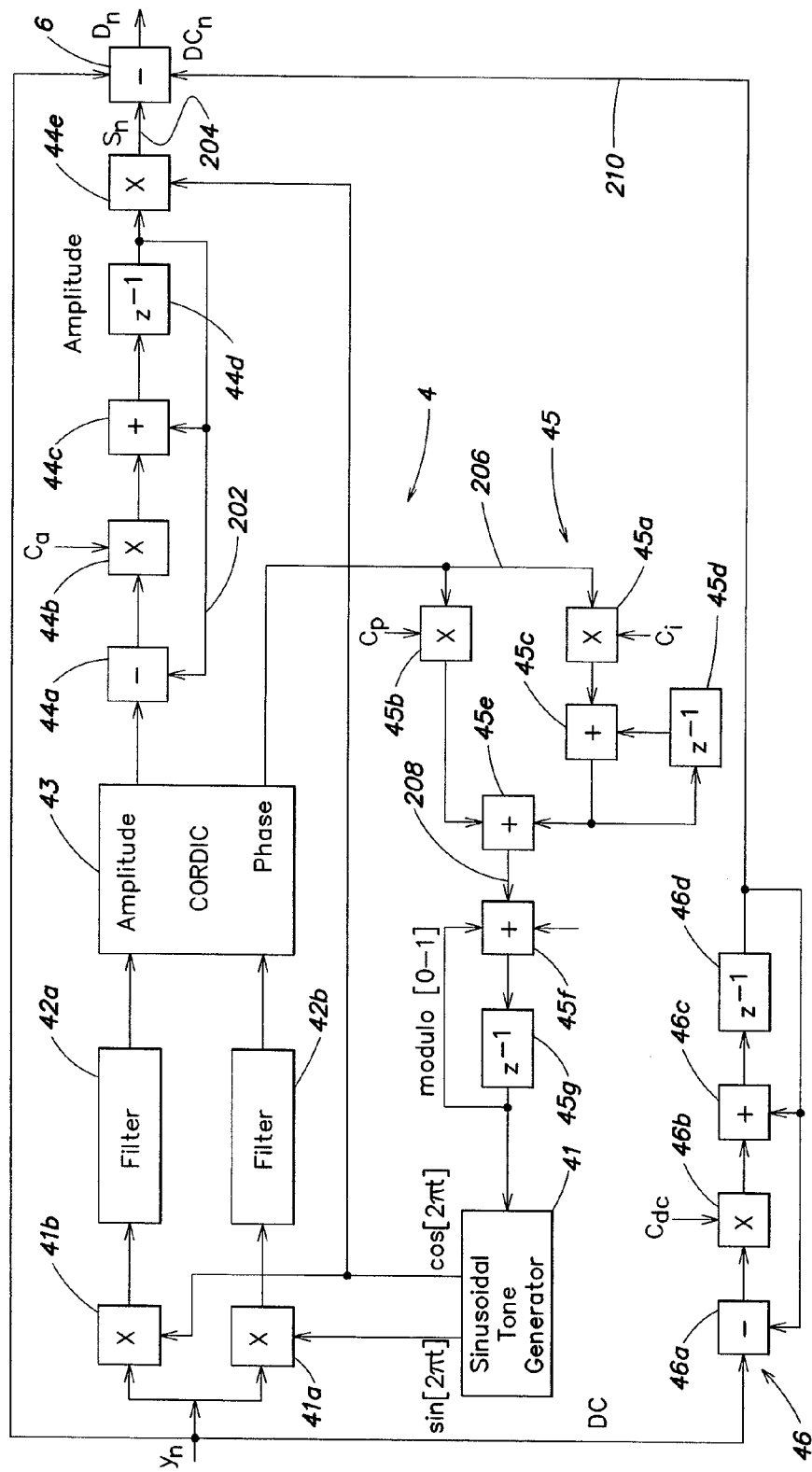
FIG. 2 is a block diagram illustration of a circuit to determine a test signal.

To this end, a circuit may be used that is based on an I/Q demodulator (I: in-phase, Q: quadrature phase) and a Cordic circuit 43, and calculates the phase and amplitude of the input sequence of the digital data $y_n$. FIG. 2 provides an example of this circuit.

Frequency, amplitude and direct current (DC) are recovered by feedback using the method known from automatic control engineering. A proportional and integral (PI) control is employed to determine the frequency. To determine amplitude and direct current, a PI-control is used in which only the proportional components are employed. The control parameters used are the P-component of the amplitude control $C_a$, the P-component for the DC components $C_{dc}$, and the P-component and I-component of the frequency control $C_p$ or $C_i$, which components are intended at the same time to meet the stability criterion for a control loop and to ensure the fastest possible transient.

The supplied sequence of the digital data $y_n$ is input to multipliers 41a, 41b. A sinusoidal signal sin[2πt] as the signal sequence to be multiplied is fed to the first of the multipliers 41a by a sinusoidal tone generator 41. Analogously, a cosine signal sequence cos[2πt] is supplied by the sinusoidal tone generator to the second multiplier 41b. After multiplication, the two data sequences are each fed to an associated filter 42a, 42b, respectively, with undersampling P. After filtering, the I-separated and Q-separated signal components are supplied to a Cordic circuit 43 which determines, a corresponding amplitude and corresponding phase that are supplied through two outputs.

The sequence representing the amplitude is input to a subtractor 44a, which also receives a feedback signal on a line 202. The subtractor 44a provides a difference signal to multiplier 44b, which multiplies the difference signal by a coefficient value $C_a$, and the resultant product is output to a summer 44c. The summer 44c sums the product with the past value. The summer 44c provides a signal sequence to a delay element 44d, which provides an output signal to a multiplier 44e. The multiplier 44e also receives a cosine signal cos[2πt] and provides the resultant product on a line 204. This system is ultimately used to determine the sequence of the output signal data $S_n$ that is then supplied to the difference-forming subtracter 6, which in turn has the sequence of the digital data $y_n$ applied to it through the second input.

The Cordic circuit 43 also outputs a corresponding phase or sequence of phase data on a line 206. This data is also fed to a circuit composed of a plurality of components 45. In the embodiment shown, this circuit is composed of two parallel multipliers 45b, 45a to which additionally a coefficient value $C_p$ or a coefficient value $C_i$ is supplied. The output signal of the multiplier 45a is fed to an adder 45c, the output signal of which is supplied both to an inverter ($z^{-1}$) 45d and to a second adder 45e. The output signal of the inverter 45d is fed to the second input of the adder 45c. Through another input, the second adder 45e receives data from the multiplier 45b in which coefficient value $C_p$ is up-multiplied for the phase data. The output data from this adder 45e are fed on line 208 to another adder 45f which has two additional inputs. A frequency ratio $F_t/F_s$ including the test frequency $F_t$ of the ADC 1 and the sampling frequency is supplied through the first additional input. An output value of the delay ($z^{-1}$) 45g connected after the adder 45f is fed through the second input. Output values of this delay 45g are supplied as the timing variable t to an input of the sinusoidal tone generator 41.

In addition, a DC component $DC_n$ is filtered out and extracted from the sequence of digital compensated data $y_n$ outputted from the compensation circuit 2. To this end, the digital compensated data $y_n$ are supplied to a circuit 46 composed of a subtracter 46a, a multiplier 46b, a adder 46c, and delay ($z^{-1}$) 46d. A control parameter $C_{dc}$ is applied through the second input to the multiplier 46b. The control parameter $C_{dc}$ determines the rate of the transient. The output data sequence from the delay 46d is supplied to the inputs of the subtracter 46a and the adder 46c, as well as to the subtracter 6 generating the difference data $D_n$.

Referring to FIG. 2, the frequency $F_t$ is thus derived using a phase-locked loop (PLL). The input signal corresponding to the sequence of compensated digital data $y_n$ is split into I-component and Q-component that are then filtered by the low-pass filters 42a and b of critical frequency B and undersampled. From the filtered I-component and Q-component, the Cordic circuit 43 then computes the amplitude and phase between input signal $y_n$ and the locally generated sinusoidal tone from the sinusoidal tone generator 41. The phase is passed to the PI control as the error signal. After a settling time, the sinusoidal tone generator 41 generates in its cosine branch a signal synchronized with the test tone. The coefficients $C_p$ and $C_i$, and test frequency $F_t$ as the known parameters determine the PI control. The amplitude is derived iteratively from the amplitude output of the Cordic circuit 43 using the control parameter $C_a$. The DC components are filtered and extracted from the output signal using the control parameter $C_{dc}$. The complete circuit composed of the test signal check device 4 (FIG. 1) and following the subtracter 6 (FIG. 1) finally generates a sequence of difference data $D_n$ according to equation (3) proportional to the nonlinear distortions.

Advantageously, available carrier-processing systems and carrier-processing methods may be utilized for the purpose of implementing this circuit. What must be added are the circuits for the amplitude and DC components.

Figure 3:
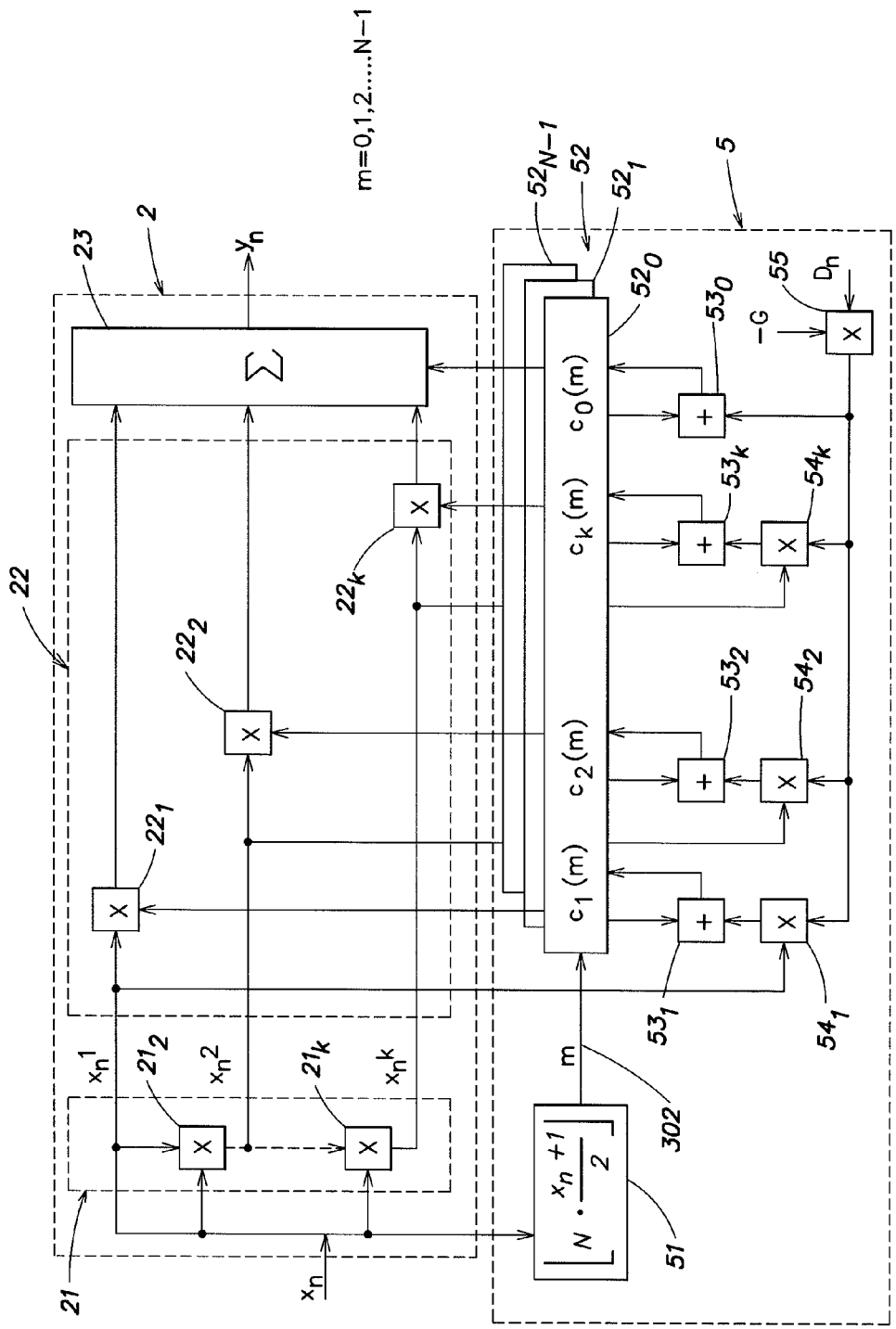
FIG. 3 is a block diagram illustration of a circuit for the iterative calculation of correction coefficients.

An especially preferred embodiment of the compensation circuit 2 is constructed segment-by-segment, as shown in FIG. 3.

The data sequence $x_n$ outputted by the ADC 1 is input to the compensation circuit 2 to a parallel system of multipliers 21. At the same time, the same input signal, i.e., once again the corresponding data value of the data sequence $x_n$, is fed to the second input of first multiplier 21$_2$ so that a squaring is effected. The output of this first multiplier 21$_2$ is supplied to the input of the second multiplier 21$_3$, and so on, such that at each subsequent stage the exponent is increased by the value one up to a value $x_n^K$.

As a result, an exponentiation is effected, where each exponentiation step has an output so that values for digital data with exponentiations $x_n^1, x_n^2, \ldots, x_n^K$ are output from the input and the field of the multipliers 21. These are then fed to another field of multipliers 22, whereby a multiplication is performed with one each of the corresponding coefficients $c_k(m)$ where $k=1, 2, \ldots, K$. What is described is thus a multi-element system with the coefficients $c_k(m)$ of the compensation in the $m^{th}$ segment with $m=0, 1, 2, \ldots, N-1$ as the $m^{th}$ segment of the amplitude range. Accordingly, the nonexponentiated value or nonexponentiated data sequence $x_n^1$ as well as the coefficient $c_1(m)$ are entered in the first multiplier 22$_1$ of the second multiplication field 22. The once exponentiated data value $x_n^2$ and the second coefficient $c_2(m)$ are entered in the second multiplier 22$_2$, etc. The output values of the multipliers 22$_1$, 22$_2$, …, 22$_K$ of second multiplication field 22 are fed to an adder 23 which performs an addition of all input values, and also of the zero$^{th}$ coefficient $c_0(m)$, then outputs the sequence of compensated digital data $y_n$.

The sequence of digital data $x_n$ output by the ADC 1 is also fed to the coefficient determination system 5, where a rounding operation is performed in an index determination device 51, taking into account the N segments during the determination of the index m. Here the sequence of the digital data $x_n$ with its respective value increased by one is divided by two, then multiplied by the number of segments N. The thus generated segment index m on a line 302 is fed to a coefficient memory system 52 that is composed of a plurality of m parallel memory components 52$_0$, 52$_1$, …, 52$_{N-1}$. The respective coefficients $c_1(m), c_2(m), \ldots, c_K(m)$ und $c_0(m)$ are stored in the individual segments of this coefficient memory system 52. For each stored index m, there is an output to an adder 53$_1$, 53$_2$, …, 53$_K$, 53$_0$, the output of which in turn is fed back to the same segment of coefficient memory system 52. The result from a multiplier 54$_1$, 54$_2$, …, 54$_K$ is entered in the second input of the adders 53$_1$, …. Each correspondingly exponentiated value of the sequence of digital data $x_n^1, x_n^2, \ldots, x_n^K$ is fed to the inputs of the multipliers 54$_1$, 54$_2$, …, 54$_K$. Supplied to each second input of the multipliers 54$_1$, 54$_2$, …, 54$_K$ is the result of a multiplier 55 to which both the corresponding values for difference data $D_n$ and the negative parameter $-G$ serving as the stability criterion are supplied. Only the value for the difference data $D_n$, multiplied by the negative parameter $-G$, is supplied to the adder 53$_0$ at the adder's second input.

Using a circuit of this type, the compensation circuit 2 may be implemented on a segment-by-segment basis. The range of input data values, that is, the sequence of digital data $x_n$, from the ADC 1 with data values from $-1$ to $+1$ is, uniformly distributed among N segments according to the expression $$-1 + \frac{2}{N}m \leq x_n \leq -1 + \frac{2}{N}(m+1),$$

where the segment index m lies between 0 and $N-1$. As a result, one coefficient set $\{c_0(m), c_1(m), \ldots, c_K(m)\}$ is assigned to each segment. Based on segmental interpolation of the characteristic, zero$^{th}$ coefficients $c_0(m)$ are added in, so that for the sequence of compensated digital data $y_n$ outputted from the compensation circuit 2 the following expression applies:

$$y_n = \sum_{k=0}^{k} c_k(m) \cdot x_n^k \text{ where } m = \left\lfloor N \cdot \frac{x_n + 1}{2} \right\rfloor, \quad (5)$$

where $\lfloor \; \rfloor$ represents the rounding operation.

The equation (5) for compensation in the compensation circuit 2, and the iterative calculation of coefficients according to equation (3) may be effectively implemented together, as FIG. 3 illustrates. In a memory of size $N \times (K+1)$, here the coefficient memory system 52, N sets of $K+1$ coefficients each $c_1(m), c_2(m), \ldots, c_K(m)$, and $c_0(m)$ are stored for the respective $m=0, 1, 2, \ldots, N-1$. For each sampling instant, the index m is derived according to equation (5) from the input signal, i.e., from the applied value for the sequence of digital data $x_n$, and assigned to the corresponding coefficient set 52$_0$, 52$_1$, …, 52$_{N-1}$, then applied accordingly within the compensation circuit 2. Also in this procedure, the stored value for each coefficient is iteratively improved according to equation (3) and stored in the same memory location.

Figure 4:
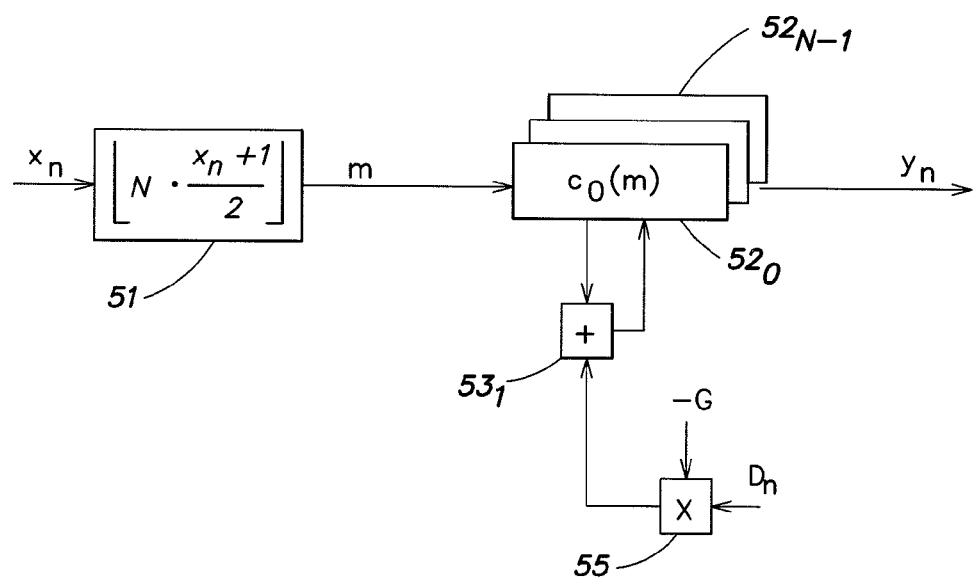
FIG. 4 is a block diagram illustration of an alternative circuit for the iterative calculation of correction coefficients using a look-up table.

As shown in FIG. 4, in a certain case the method with segmental interpolation may be simplified with $N=2^B$. For this purpose, it is necessary that the number N of segments agree with the resolution of the signal or the sequence of digital data $x_n$, i.e., $N=2^B$ applies, where B is the number of bits per sampling value given a signal range between $-2^{B-1}$ and $2^{B-1}-1$ and only one coefficient per segment, i.e., $K=0$.

The circuit of FIG. 3 is thereby reduced to the circuit of FIG. 4 which has, following the index determination device 51 for determining the index m, a look-up table with $2^B$ adaptive coefficients $c_0(m)$ in memory fields 52$_0$, …, 52$_{N-1}$. In this arrangement, all the multipliers 54 are eliminated so that only the first addition stage with adders 53$_1$, … remains, as described above.

Initial synthetic calculations using a sinusoidal tone as the test signal s(t) and a mathematical model of the analog-to-digital characteristic with frequencies $F_s=40.5$ MHz, $F_t=1.84$ MHz, the A/D model with coefficients for the calculation based on $0.9895x+0.0028x^2+0.024x^3-0.0064x^4$ and for compensation $N=1$ segments, and a maximum running index of m with $K=4$, produced significant improvements. After analog-to-digital conversion, the initial value was $-60.3$ dB, and after compensation the value was 80.9 dB—yielding a significant improvement of 20.5 dB. In the case of one measurement (K3), the improvement found was $-47.2$ dB after A/D conversion, as compared with $-56.3$ dB after compensation, giving an improvement of 9.1 dB. The ratio of distortions to outputs after A/D conversion was $-46.8$ dB, as compared with $-55.3$ dB after compensation—producing an improvement of 8.4 dB.

In place of a plurality of individual components, as described above, an implementation is also possible in an analogously capable computer chip, or in a monolithically fabricated semiconductor device in the form of an integrated circuit or the like.

Although the present invention has been shown and described with respect to several preferred embodiments thereof, various changes, omissions and additions to the form and detail thereof, may be made therein, without departing from the spirit and scope of the invention.

The invention claimed is:

1. A system for compensating for distortion within an analog-to-digital converter, the system comprising:
    a test signal generator that provides an analog test signal and a digitized test signal indicative of the analog test signal;
    an analog-to-digital converter that selectively receives an input signal and the analog test signal and provides a digitized signal;
    a compensation circuit that receives the digitized signal and filter coefficients, and provides a compensated digitized signal;
    a test signal check device that receives and processes the compensated digitized signal to extract a sequence of output data;
    a difference unit that receives the sequence of output data and the compensated digitized signal and provides a difference signal indicative of the difference; and
    a coefficient determination unit that receives the difference signal and the digitized signal and provides the filter coefficients.

2. The system of claim 1, where the compensation circuit comprises a compensator unit that provides the compensated digitized signal $y_n$ based upon the expression $$y_n = \sum_{k=0}^{k} c_k(m) \cdot x_n^k.$$

3. The system of claim 2, where the coefficients $c_k$ are computed as a function of the digitized signal.

4. The system of claim 1, where the compensation circuit comprises a compensator unit that provides the compensated digitized signal $y_n$ based upon the expression $$y_n = \sum_{k=0}^{k} c_k(m) \cdot x_n^k \text{ where } m = \left\lfloor N \cdot \frac{x_n + 1}{2} \right\rfloor.$$

5. The system of claim 1, where the test signal check device comprises a CORDIC unit responsive to in-phase and quadrature components of the digitized signal $y_n$ to provide an amplitude signal to a DC component recovery circuit that provides the sequence of output data.

6. The system of claim 1, further comprising a timing unit that selectively determines whether the input signal or the analog test signal is processed by the analog-to-digital converter.

7. The system of claim 1, further comprising a timing unit that selectively determines whether the input signal or the analog test signal is processed by the analog-to-digital converter.

8. A system for compensating for distortion within an analog-to-digital converter, the system comprising:
    means for providing an analog test signal;
    an analog-to-digital converter that selectively receives an input signal and the analog test signal and provides a digitized signal;
    compensation means for receiving the digitized signal and adaptive filter coefficients, and for providing a compensated digitized signal;
    means for receiving and processing the compensated digitized signal to extract a sequence of output data;
    a difference unit that receives the sequence of output data and the compensated digitized signal and provides a difference signal indicative of the difference; and
    means responsive to the difference signal and the digitized signal for providing the filter coefficients.

9. The system of claim 8, where the compensation circuit comprises a compensator unit that provides the compensated digitized signal $y_n$ based upon the expression $$y_n = \sum_{k=0}^{k} c_k(m) \cdot x_n^k.$$

10. The system of claim 9, where the coefficients $c_k$ are computed as a function of the digitized signal.

11. The system of claim 8, where the compensation circuit comprises a compensator unit that provides the compensated digitized signal $y_n$ based upon the expression $$y_n = \sum_{k=0}^{k} c_k(m) \cdot x_n^k \text{ where } m = \left\lfloor N \cdot \frac{x_n + 1}{2} \right\rfloor.$$

12. The system of claim 8, where the means for receiving and processing comprises a CORDIC unit responsive to in-phase and quadrature components of the digitized signal $y_n$ to provide an amplitude signal to a DC component recovery circuit that provides the sequence of output data.

13. The system of claim 8, further comprising a timing unit that selectively determines whether the input signal or the analog test signal is processed by the analog-to-digital converter.

14. A system for compensating for distortion within an analog-to-digital converter, the system comprising:
    a test signal generator that provides an analog test signal;
    an analog-to-digital converter that selectively receives an input signal and the analog test signal and provides a digitized signal;
    compensation means for receiving the digitized signal and filter coefficients, and for providing a compensated digitized signal;
    means for receiving and processing the compensated digitized signal to extract a sequence of output data;
    a difference unit that receives the sequence of output data and the compensated digitized signal and provides a difference signal indicative of the difference; and
    means responsive to the difference signal and the digitized signal for providing the filter coefficients.

15. The system of claim 14, where the compensation means comprises a compensator unit that provides the compensated digitized signal $y_n$ based upon the expression $$y_n = \sum_{k=0}^{k} c_k(m) \cdot x_n^k.$$

16. The system of claim 15, where the coefficients $c_k$ are computed as a function of the digitized signal.

17. The system of claim 14, where the compensation means comprises a compensator unit that provides the compensated digitized signal $y_n$ based upon the expression $$y_n = \sum_{k=0}^{k} c_k(m) \cdot x_n^k \text{ where } m = \left\lfloor N \cdot \frac{x_n + 1}{2} \right\rfloor.$$

18. The system of claim 14, where the menas for receiving and processing comprises a CORDIC unit responsive to in-phase and quadrature components of the digitized signal $y_n$ to provide an amplitude signal to a DC component recovery circuit that provides the sequence of output data.

* * * * *

UNITED STATES PATENT AND TRADEMARK OFFICE
CERTIFICATE OF CORRECTION

PATENT NO. : 7,330,141 B2 Page 1 of 1
APPLICATION NO. : 10/779317
DATED : February 12, 2008
INVENTOR(S) : Temerinac et al.

It is certified that error appears in the above-identified patent and that said Letters Patent is hereby corrected as shown below:

Column 2
line 9, delete "of" and insert --to--
line 36, after "ADC" delete "converter"

Column 4
line 42, before "output", insert --the--

Column 12
line 8, delete "means" and insert --means--

Signed and Sealed this

Twenty-seventh Day of May, 2008

JON W. DUDAS
*Director of the United States Patent and Trademark Office*